(12) United States Patent
Fukuda et al.

(10) Patent No.: US 7,218,560 B2
(45) Date of Patent: May 15, 2007

(54) SEMICONDUCTOR MEMORY DEVICE

(75) Inventors: Ryo Fukuda, Yokohama (JP); Yohji Watanabe, Yokohama (JP); Shuso Fujii, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/293,378

(22) Filed: Dec. 5, 2005

(65) Prior Publication Data

US 2006/0119415 A1    Jun. 8, 2006

(30) Foreign Application Priority Data

Dec. 8, 2004    (JP) .............................. 2004-355720

(51) Int. Cl.
*G11C 7/00*    (2006.01)
(52) U.S. Cl. ...................... 365/200; 257/529; 257/209; 365/225.7
(58) Field of Classification Search ................ 365/200, 365/225.7; 257/529, 209
See application file for complete search history.

(56) References Cited

U.S. PATENT DOCUMENTS 5,457,656 A * 10/1995 Fu ............................. 365/200
6,438,044 B2 * 8/2002 Fukuda ....................... 365/200
6,477,072 B2 * 11/2002 Shimizu et al. ............... 365/51
6,525,350 B1 * 2/2003 Kinoshita et al. ........... 257/202
6,762,918 B2    7/2004 Voldman

FOREIGN PATENT DOCUMENTS

JP    2004-111959    4/2004

* cited by examiner

*Primary Examiner*—Huan Hoang
*Assistant Examiner*—Anthan Tran
(74) *Attorney, Agent, or Firm*—Oblon, Spivak, McClelland, Maier & Neustadt, P.C.

(57) ABSTRACT

A semiconductor memory device includes a fuse element including a first terminal and a second terminal, which stores data based on whether or not it is electrically blown by a laser beam, a resistance element connected to the first terminal, a node in which the data is transferred, and a transistor provided between the resistance element and the node, which sets the data to the node.

4 Claims, 8 Drawing Sheets

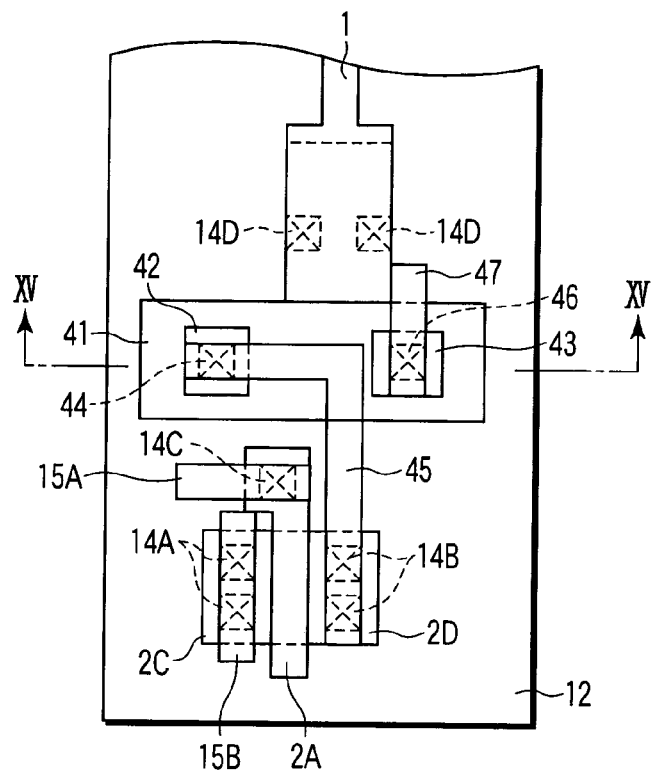
F I G. 14
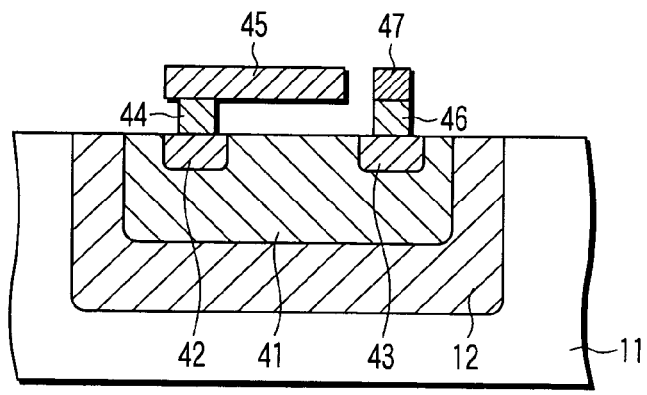
F I G. 15
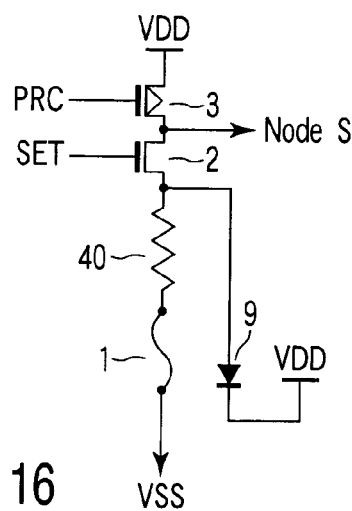
F I G. 16
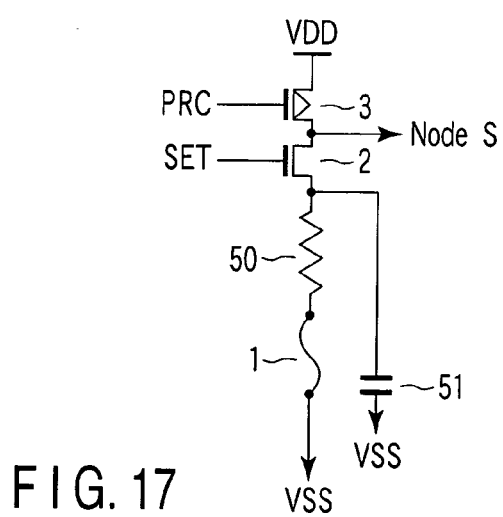
F I G. 17

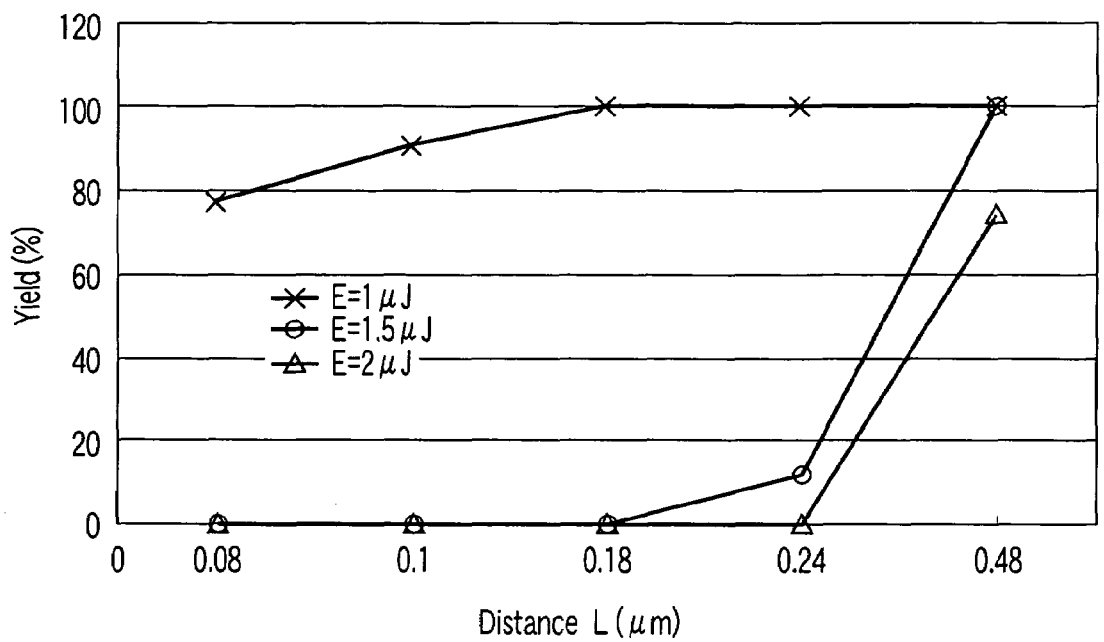
FIG. 22
| Distance L (μm) | 0.08 | 0.1 | 0.18 | 0.235 | 0.48 |
|---|---|---|---|---|---|
| L/M | 1 | 1.25 | 2.25 | 2.93 | 6 |
| L/Size of contact plug | 0.89 | 1.11 | 2 | 2.61 | 5.33 |
| L/Gate length | 2 | 2.5 | 4.5 | 5.875 | 12 |
| L/Tox | 80 | 100 | 180 | 235 | 480 |
FIG. 23
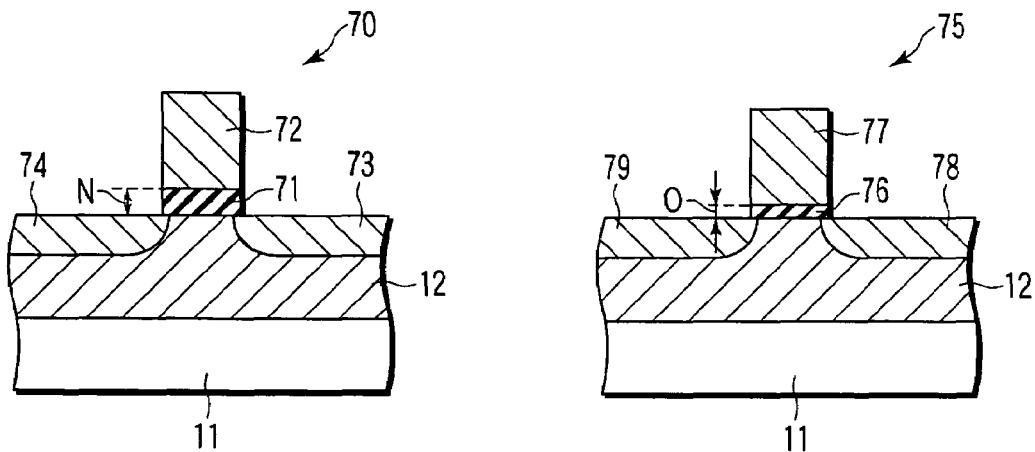
FIG. 24  FIG. 25

SEMICONDUCTOR MEMORY DEVICE

CROSS-REFERENCE TO RELATED APPLICATIONS

This application is based upon and claims the benefit of priority from prior Japanese Patent Application No. 2004-355720, filed Dec. 8, 2004, the entire contents of which are incorporated herein by reference.

BACKGROUND OF THE INVENTION

1. Field of the Invention

The present invention relates to a semiconductor memory device, and more specifically, to a semiconductor memory device including a non-volatile memory element.

2. Description of the Related Art

In semiconductor memory devices, a non-volatile memory device is programmed in order to store data used for rescue of a defective memory cell, setting of an operation mode, etc. For example, in a redundancy circuit of a memory, a fuse element is used as a non-volatile memory element in order to store an address of a defective memory cell.

The fuse element made of, for example, a metal stores data (data "0" and data "1") based on whether or not it is blown. As a system for programming the fuse element, the laser fuse system is mainly employed, in which the fuse element is vaporized with a laser beam to disconnect it. In order to reliably break ("blow") a fuse element using the laser fuse system, it is necessary to apply a laser beam of a sufficient energy to the fuse element.

In recent years, as the density of the integration of the semiconductor memory device increases, the size of the transistor used in the semiconductor memory device is reduced. However, the semiconductor memory device that includes a transistor of a reduced size, entails the following drawback. That is, when the fuse element is blown with a laser beam, the transistor connected to the fuse element or the oxide film or diffusion layer of a transistor located near the fuse element are destroyed due to the energy of the disconnection of the fuse element. Thus, there might occur such a problem that a semiconductor memory device that comprises a nonvolatile memory element cannot realize the function as a ROM (read only memory).

As a related technique to the above-described conventional technique, there has been proposed a device that can program a fuse element with high energy (see Jpn. Pat. Appln. KOKAI Publication No. 2004-111959).

BRIEF SUMMARY OF THE INVENTION

According to a first aspect of the present invention, there is provided a semiconductor memory device comprising: a fuse element including a first terminal and a second terminal, which stores data based on whether or not it is electrically blown by a laser beam; a resistance element connected to the first terminal; a node in which the data is transferred; and a transistor provided between the resistance element and the node, which sets the data to the node.

According to a second aspect of the present invention, there is provided a semiconductor memory device comprising: a fuse element including a first terminal and a second terminal, which stores data based on whether or not it is electrically blown by a laser beam; a node in which the data is transferred; a semiconductor region provided in a substrate; and a first transistor provided between the first terminal and the node, which sets the data to the node, and includes a gate insulating film provided on the semiconductor region, a first gate electrode provided on the gate insulating film and a first source region and a first drain region provided in the semiconductor region, the first source region being connected to the first terminal via a first contact plug, the first drain region being connected to the node via a second contact plug, wherein a first distance between the first gate electrode and the first contact plug is longer than a second distance between the first gate electrode and the second contact plug.

According to a third aspect of the present invention, there is provided a semiconductor memory device comprising: a fuse element including a first terminal and a second terminal, which stores data based on whether or not it is electrically blown by a laser beam; a node in which the data is transferred; a semiconductor region provided in a substrate; a first transistor provided between the first terminal and the node, which sets the data to the node, and includes a gate insulating film provided on the semiconductor region and having a first thickness, a first gate electrode provided on the gate insulating film and a first source region and a first drain region provided in the semiconductor region; and a latch circuit connected to the node and including a plurality of second transistors each including a second gate insulating film having a second thickness, wherein the first thickness is larger than the second thickness.

BRIEF DESCRIPTION OF THE SEVERAL VIEWS OF THE DRAWING

FIG. 14 is a diagram showing a layout of a structure of a main part of the semiconductor memory device shown in FIG. 13;

FIG. 15 is a cross sectional view taken along a line XV—XV shown in FIG. 14;

FIG. 16 is a circuit diagram showing a structure of a main part of another version of the semiconductor memory device according to the third embodiment;

FIG. 17 is a circuit diagram equivalent to a structure of a semiconductor memory device according to the fourth embodiment of the present invention;

FIG. 22 is a graph illustrating a relation between a distance L between a gate and contact, and a yield;

FIG. 23 is a diagram illustrating the ratio between the distance L and some other numerical value of the transistor 60;

FIG. 24 is a cross sectional view showing a structure of an N-channel MOS transistor 70 according to the sixth embodiment of the present invention; and FIG. 25 is a cross sectional view showing a structure of an N-channel MOS transistor 75 that forms a latch circuit.

DETAILED DESCRIPTION OF THE INVENTION

Figure 1:
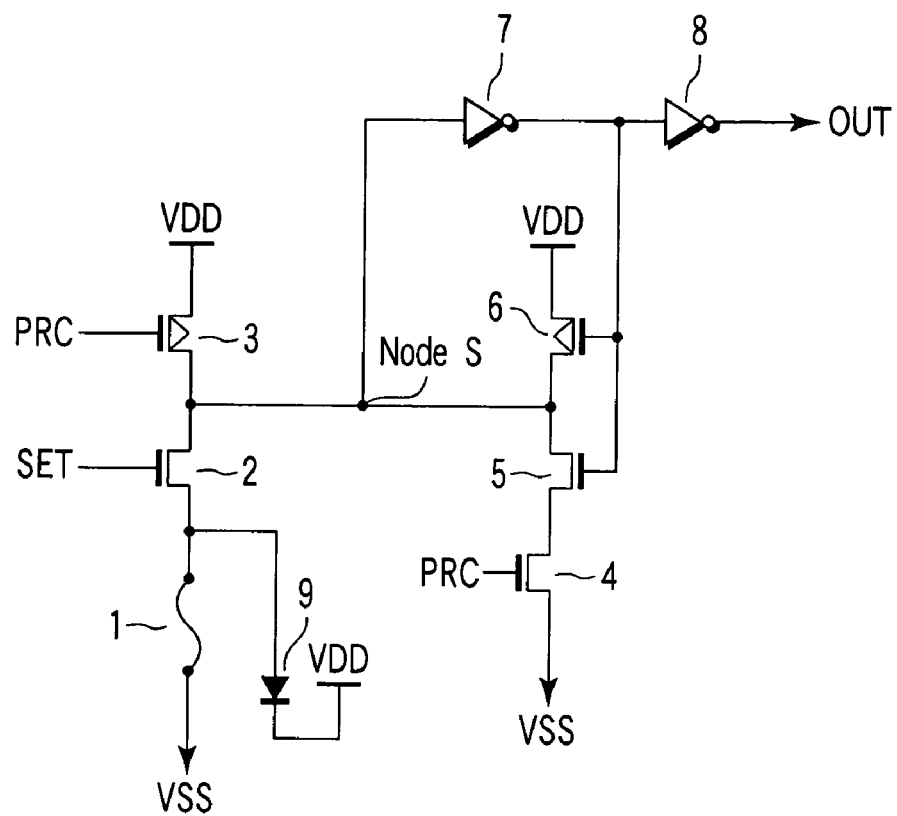
FIG. 1 is a circuit diagram showing a structure of a semiconductor memory device according to the first embodiment of the present invention.

Embodiments of the invention will be described with reference to the accompanying drawings. In the description below, elements having the same function and structure are denoted by the same reference numerals, and a duplicate explanation will be given only when necessary.

First Embodiment

FIG. 1 is a circuit diagram showing a structure of a semiconductor memory device according to the first embodiment of the present invention. As shown in this figure, a precharge signal PRC is input to a gate of a P-channel MOS transistor 3, and a source of the transistor 3 is connected to a power potential VDD. A drain of the transistor 3 is connected to a node S.

The transistor 3 is provided to pre-charge the node S. The transistor 3 pre-charges the node S to a high level (power potential VDD) when the pre-charge signal PRC is activated (low level (ground potential VSS)).

A set signal SET is input to a gate of an N channel MOS transistor 2. A drain of the transistor 2 is connected to the node S. A source of the transistor 2 is connected to one terminal of a fuse element 1. Another terminal of the fuse element 1 is connected to a ground potential VSS. The one terminal of the fuse element 1 is connected to an anode of a diode 9. A cathode of the diode 9 is connected to the power potential VDD.

The fuse element 1 is made of a material that can be blown with a laser beam (, that is, for example, a metal). The fuse element 1 stores data (data "0" and data "1"). More specifically, the fuse element 1 is evaporated to disconnect it by applying a laser beam to the fuse element 1. Thus, the fuse element 1 stores data "0". When the fuse element 1 is not disconnected, it stores data "1".

The transistor 2 is provided to set the data of the fuse element 1 to the node S. When the set signal SET is activated (at the high level), the data of the fuse element 1 is set to the node S.

The node S is connected to an input terminal of an inverter circuit 7. An output terminal of the inverter circuit 7 is connected to a gate of a P-channel MOS transistor 6 and a gate of an N-channel MOS transistor 5. A source of the transistor 6 is connected to the power potential VDD. Drains of both the transistors 5 and 6 are connected to the node S.

The inverter circuit 7 and the transistors 5 and 6 form a latch circuit. With this structure, the latch circuit serves to fix the data set to the node S even when the precharge signal PRC and the set signal SET are in a non-activated state.

A source of the transistor 5 is connected to a drain of an N-channel MOS transistor 4. The precharge signal PRC is input to a gate of the N-channel MOS transistor 4. A source of the transistor 4 is connected to the ground potential VSS.

The transistor 4 is provided to reduce the leak current from the node S. The transistor 4 disables the transistor 5 while the precharge signal PRC being activated and the node S is being held at a high level. In this manner, the leak current from the node S can be reduced.

The output terminal of the inverter circuit 7 is connected to an input terminal of an inverter circuit 8. The inverter circuit 8 outputs an output signal OUT. It should be noted that a back bias (substrate bias) of each of the P-channel MOS transistors is connected to the respective power potential VDD, whereas a back bias of each of the N-channel MOS transistors is connected to the respective ground potential VSS, although they are not illustrated in the figure.

Figure 2:
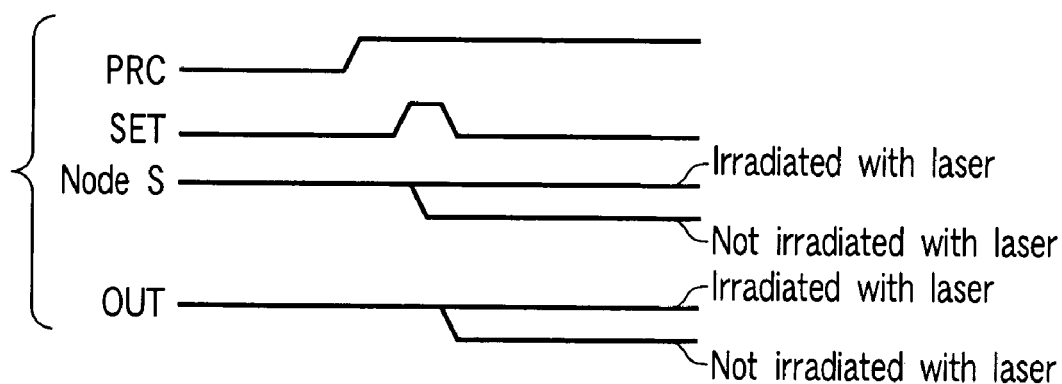
FIG. 2 is a timing chart illustrating an operation of the semiconductor memory device shown in FIG. 1;.

FIG. 2 is a timing chart illustrating an operation of the semiconductor memory device shown in FIG. 1. In the initial state, the precharge signal PRC is activated (at low level) and the set signal SET is inactivated (at low level). In this state, the transistor 3 is in the ON state, and therefore the node S is set at the high level.

After that, the precharge signal PRC is inactivated (at high level). During this state, the node S remains unchanged. After that, the set signal SET is activated (at high level). When the fuse element 1 is disconnected, the transistor 2 is turned ON. However, there is no path connected to the ground potential VSS, the source of the transistor 2 is connected to the ground potential VSS at a high resistance. At this point, the transistor 6 is in the ON state, and therefore the node S is maintained at the high level.

On the other hand, when the fuse element 1 is not disconnected, the node S is connected to the ground potential VSS via the transistor 2 and the fuse element 1. When the resistance of this path is set low, the node S overcomes the transistor 6 and pulled out to the low level. Thus, when the fuse element 1 is disconnected, the node S and output signal OUT are set to the high level. When the fuse element 1 is not disconnected, the node S and the output signal OUT are set to the low level. Thus, the semiconductor memory device realizes the functions as a ROM.

Figure 3:
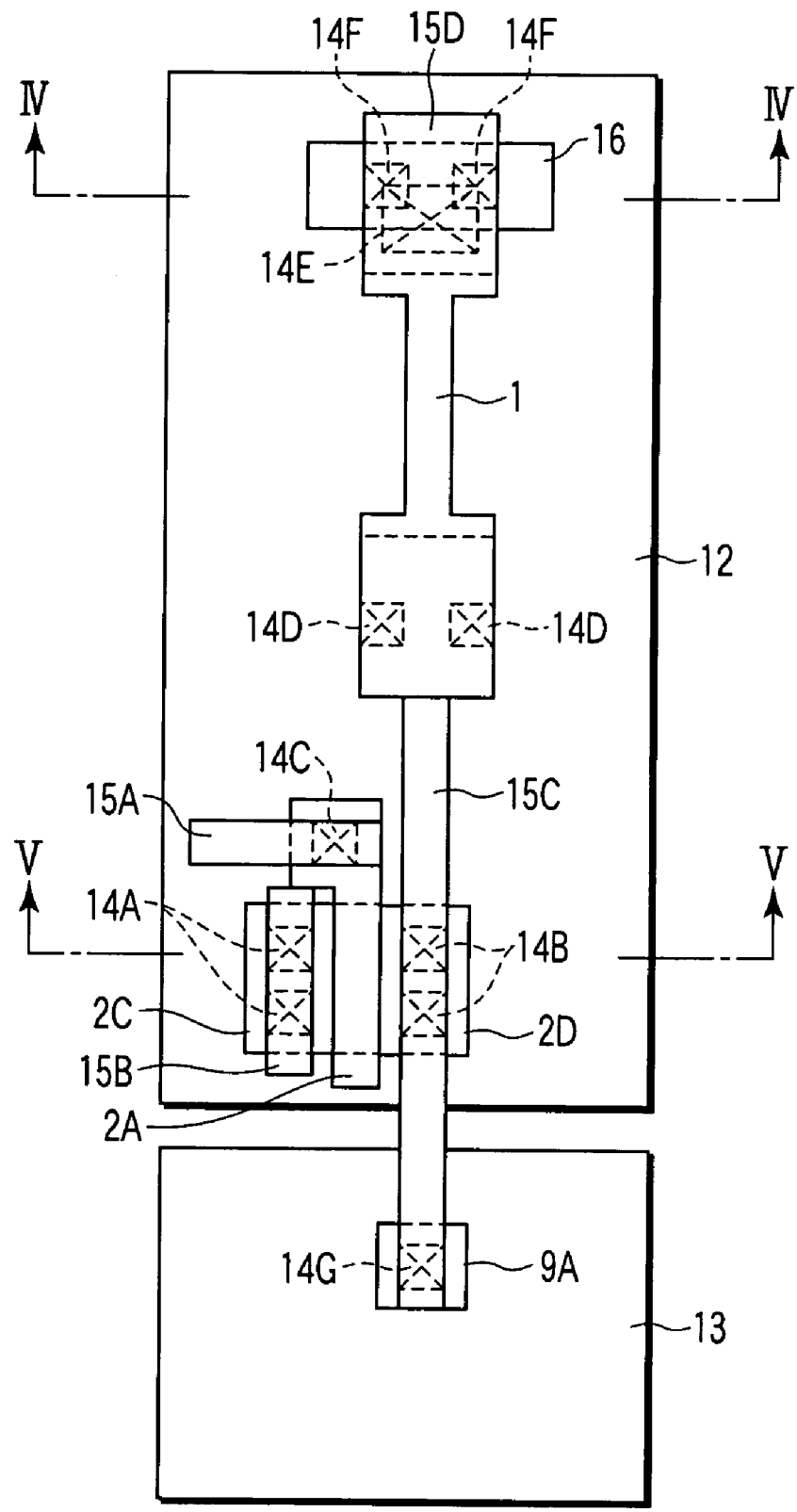
FIG. 3 is a diagram showing a layout of a structure of a main part of the semiconductor memory device shown in FIG. 1.
Figure 4:
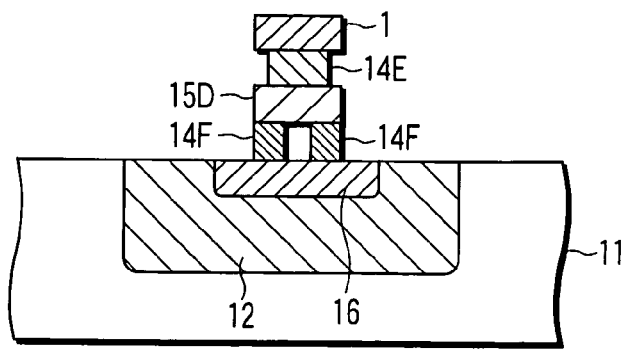
FIG. 4 is a cross sectional view taken along a line IV—IV shown in FIG. 3.
Figure 5:
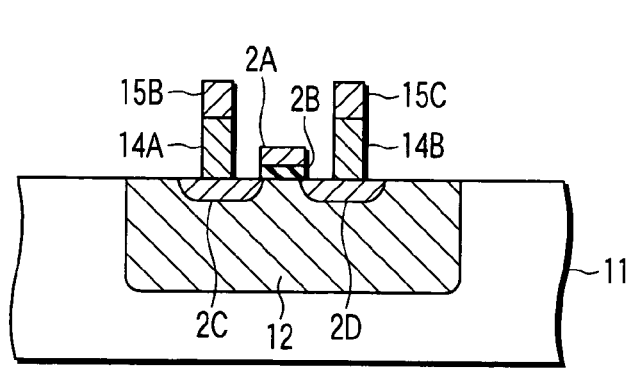
FIG. 5 is a cross sectional view taken along a line V—V shown in FIG. 3.

FIG. 3 is a diagram showing a layout of a structure of a main part (including the fuse element 1, the transistor 2 and a diode 9) of the semiconductor memory device shown in FIG. 1. FIG. 4 is a cross sectional view taken along a line IV—IV shown in FIG. 3, and FIG. 5 is a cross sectional view taken along a line V—V shown in FIG. 3.

The semiconductor substrate 11 includes a P-type well 12 formed by diffusing a low-concentration P-type impurity and an N-type well 13 formed by diffusing a low-concentration N-type impurity. The P-type well 12 is provided with the N-channel MOS transistor 2.

More specifically, a gate electrode 2A is provided via a gate insulating film 2B on the P-type well 12. A gate insulating film 2B is made of, for example, $SiO_2$. $N^+$-type diffusion regions 2C (drain region) and 2D (source region) are provided in the P-type well 12 on both sides of the gate electrode 2A, and in each of these regions a high-concentration N-type impurity is injected.

The gate electrode 2A is connected to a metal layer 15A via a contact plug 14C. The precharge signal PRC is supplied to the metal layer 15A. The $N^+$-type diffusion region 2C is connected to a metal layer 15B via a contact plug 14A. The metal layer 15B is connected to the node S.

The $N^+$-type diffusion region 2D is connected to a metal layer 15C via a contact plug 14B. One end of the metal layer 15C is connected to the fuse element 1 via a contact plug 14D. The fuse element 1 is blown when a laser beam is applied to its narrow portion.

The fuse element 1 is connected to a metal layer 15D via a contact plug 14E. A $P^+$-type diffusion region 16 is provided in the P-type well 12, and in this diffusion region, a high-concentration P-type impurity is injected. The $P^+$-type diffusion region 16 is connected to a metal layer 15D via a contact plug 14F.

another end of the metal layer 15C is connected to the diode 9. More specifically, a $P^+$-type diffusion region 9A is provided in the N-type well 13, and in this diffusion region, a high-concentration P-type impurity is injected. The $P^+$-type diffusion region 9A is connected to the metal layer 15C via a contact plug 14G. As shown in FIG. 3, the $P^+$-type diffusion region 9A, which forms the diode 9 is provided as a new region separate from the $P^+$-type diffusion region, which forms the P-channel MOS transistors of the semiconductor memory device.

Further, as described before, the back bias of each P-channel MOS transistor is connected to the power potential VDD, and the back bias of each N-channel MOS transistor is connected to the ground potential VSS. In other words, the ground potential VSS is supplied to the P-type well formed in the semiconductor substrate 11, whereas the power potential VDD is supplied to the N-type well formed in the semiconductor substrate 11. Similarly, the power potential VDD is supplied to the N-type well 13 that forms the diode 9.

Figure 6:
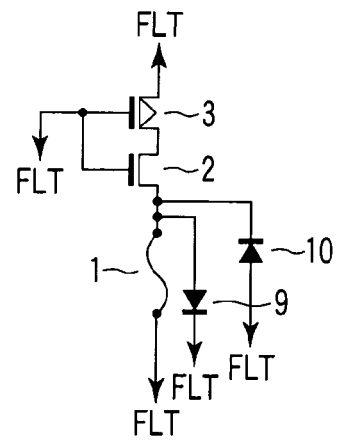
FIG. 6 is a circuit diagram equivalent to that of the semiconductor memory device shown in FIG. 1 in the case where a fuse element 1 is blown with a laser beam.

Next, the operation of the semiconductor device when the fuse element 1 is blown with a laser beam will now be described. FIG. 6 is a circuit diagram equivalent to that of the semiconductor memory device shown in the case where the fuse element 1 is blown with a laser beam.

The diode 10 shown in FIG. 6 is illustrated by an equivalent diode which corresponds to a PN junction of the N-channel MOS transistor 2. The PN junction of the N-channel MOS transistor 2 is made of the $N^+$-type diffusion region 2D and the P-type well 12. The irradiation of the laser beam is carried out by a laser repair device without connecting the power (the power potential VDD and the ground potential VSS, etc.) to the semiconductor memory device. With this structure, each power node is in a floating state (FLT) which has a capacity inside the chip. Since the area of the well is so large that the floating state is not substantially different from the grounded state.

As described above, the diode 9 includes the $P^+$-type diffusion region 9A and the N-type well 13. In other words, the diode 9 is a diode connected in a forward direction with respect to the fuse element 1. With this arrangement, a positive charge generated in the fuse element 1 can be released to the N-type well 13 while disconnecting the fuse element 1 with a laser beam. Thus, the entering of the positive charge into the transistor 2 can be prevented, and thus it is possible to prevent the breakdown of the PN junction and insulating film of the transistor 2.

On the other hand, the diode 10 is a diode connected in a backward direction with respect to the fuse element 1. With this arrangement, a negative charge generated in the fuse element 1 can be released to the P-type well 12 while disconnecting the fuse element 1 with a laser beam. Thus, the entering of the negative charge into the transistor 2 can be prevented, and thus it is possible to prevent the breakdown of the PN junction and insulating film of the transistor 2.

As described above in detail, the diode 9 including the $P^+$-type diffusion region 9A and the N-type well 13, is connected to the fuse element 1 in this embodiment. Further, the $P^+$-type diffusion region 9A, which is a part of the diode 9, is provided as a new region separate from the $P^+$-type diffusion region, which forms the P-channel MOS transistors of the semiconductor memory device.

Therefore, according to this embodiment, it is possible to prevent the breakdown of the N-channel MOS transistor 2 connected to the fuse element 1, which is caused by the positive charge generated while disconnecting the fuse element 1 with a laser beam.

Further, with the connection of the N-channel MOS transistor 2 to the fuse element 1, it is possible to prevent the breakdown of the N-channel MOS transistor 2, which is caused by the negative charge generated while disconnecting the fuse element 1 with a laser beam.

It should be noted that this embodiment illustrates, as an example, a case of the MOS transistor as a transistor equipped in a semiconductor memory device. However, the present invention is not limited to this embodiment, but it can be carried out similarly if a bipolar transistor is used. That is, even if the N-channel MOS transistor is replaced by an NPN-type transistor, and the P-channel MOS transistor is replaced by a PNP-type transistor, the same advantageous effect as that of this embodiment can be obtained. This is also the case for each of the embodiments that follow.

Second Embodiment

The second embodiment is a semiconductor memory device with such a structure that can prevent the breakdown of a P-channel MOS transistor connected to a fuse element 1.

Figure 7:
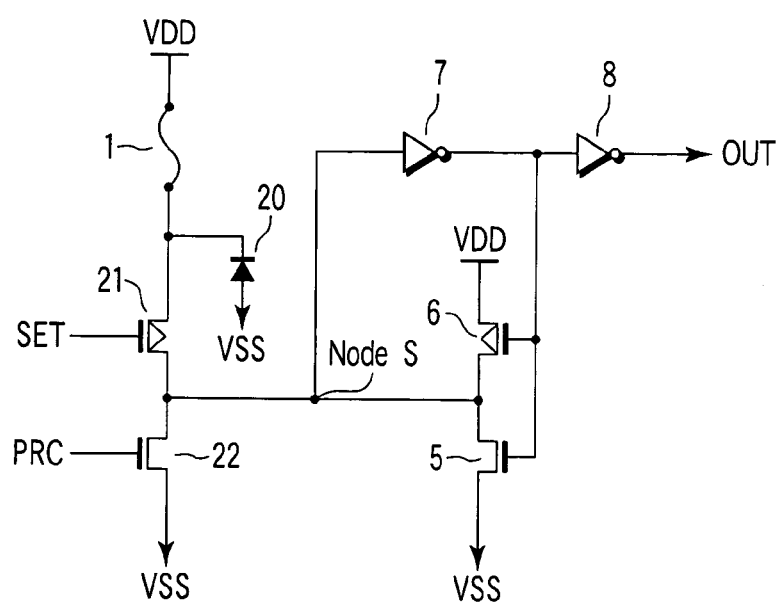
FIG. 7 is a circuit diagram showing a structure of a semiconductor memory device according to the second embodiment of the present invention.

FIG. 7 is a circuit diagram showing a structure of a semiconductor memory device according to the second embodiment of the present invention. As shown in this figure, a terminal of the fuse element 1 is connected to a power potential VDD, and another end of the fuse element 1 is connected to the source of a P-channel MOS transistor 21.

A set signal SET is input to a gate of the transistor 21. A drain of the transistor 21 is connected to a node S. A precharge signal PRC is input to a gate of an N-channel MOS transistor 22, and a drain of the transistor 22 is connected to the node S. A source of the transistor 22 is connected to a ground potential VSS.

Another terminal of the fuse element 1 is connected to a cathode of a diode 20. An anode of the diode 20 is connected to the ground potential VSS.

The transistor 22 is provided to pre-charge the node S. The transistor 22 pre-charges the node S to a low level when the pre-charge signal PRC is activated (high level).

The fuse element 1 stores data (data "0" and data "1"). More specifically, the fuse element 1 is evaporated to blow it by applying a laser beam to the fuse element 1. Thus, the fuse element 1 stores data "1". When the fuse element 1 is not blown, it stores data "0".

The transistor 22 is provided to set the data of the fuse element 1 to the node S. When the set signal SET is activated (at the low level), the data of the fuse element 1 is set to the node S by the transistor 22.

The node S is connected to a latch circuit (including an inverter circuit 7, a P-channel MOS transistor 6 and an N-channel MOS transistor 5). An output terminal of the latch circuit is connected to an input terminal of an inverter circuit 8. The inverter circuit 8 outputs an output signal OUT. It should be noted that a back bias of each of the P-channel MOS transistors is connected to the respective power potential VDD, whereas a back bias of each of the N-channel MOS transistors is connected to the respective ground potential VSS, although they are not illustrated in the figure.

Figure 8:
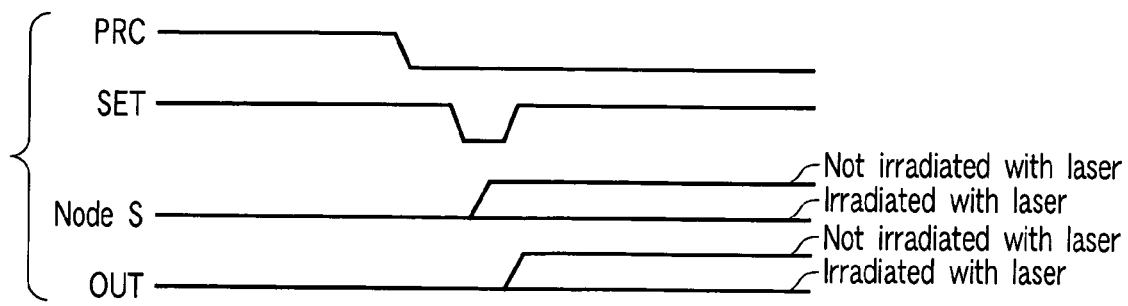
FIG. 8 is a timing chart illustrating an operation of the semiconductor memory device shown in FIG. 7.

FIG. 8 is a timing chart illustrating an operation of the semiconductor memory device shown in FIG. 7. In the initial state, the precharge signal PRC is activated (at high level) and the set signal SET is inactivated (at high level). In this state, the transistor 22 is in the ON state, and therefore the node S is set at the low level.

After that, the precharge signal PRC is inactivated (at low level). During this state, the node S remains unchanged. After that, the set signal SET is activated (at low level), and the transistor 21 is turned ON. When the fuse element 1 is blown, there is not a path that connects the power potential VDD to the source of the transistor 21. Therefore, the source of the transistor 21 is connected to the power potential VDD at a high resistance. At this point, the transistor 5 is in the ON state, and therefore the node S is maintained at the low level.

On the other hand, when the fuse element 1 is not blown, the node S is connected to the power potential VDD via the transistor 21 and the fuse element 1. When the resistance of this path is set low, the node S overcomes the transistor 5 and is pulled out to the high level. Thus, when the fuse element 1 is blown, the node S and output signal OUT are set to the low level. When the fuse element 1 is not blown, the node S and the output signal OUT are set to the high level. Thus, the semiconductor memory device shown in FIG. 7 realizes the functions as a ROM.

Figure 9:
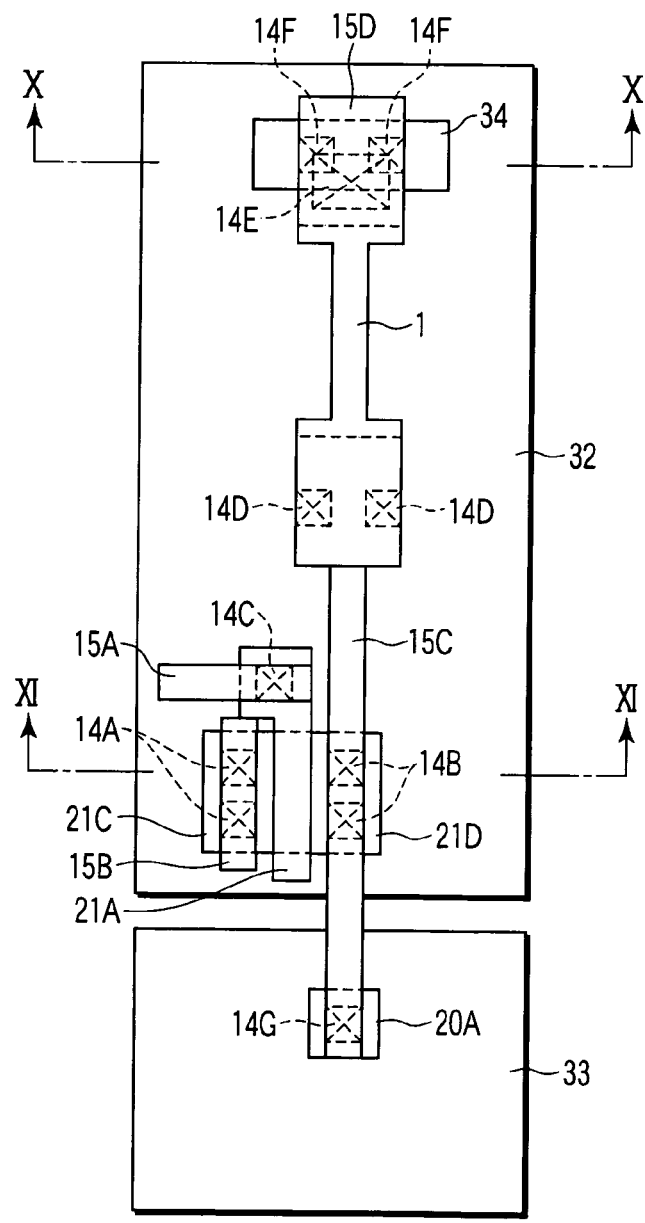
FIG. 9 is a diagram showing a layout of a structure of a main part of the semiconductor memory device shown in FIG. 7.
Figure 10:
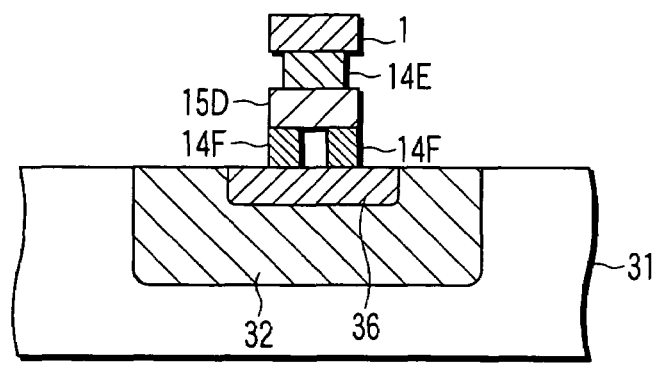
FIG. 10 is a cross sectional view taken along a line X—X shown in FIG. 9.
Figure 11:
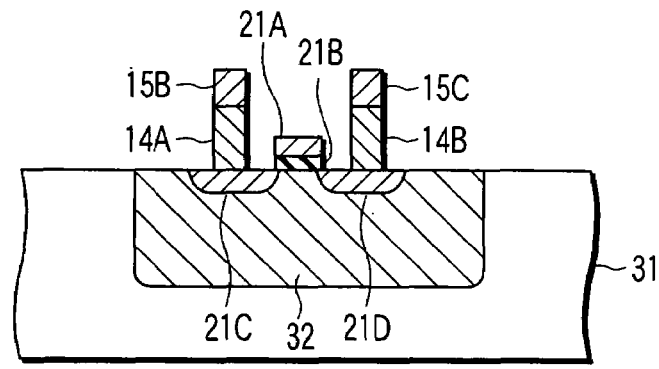
FIG. 11 is a cross sectional view taken along a line XI—XI shown in FIG. 9.

FIG. 9 is a diagram showing a layout of a structure of a main part (including the fuse element 1, the transistor 21 and a diode 20) of the semiconductor memory device shown in FIG. 7. FIG. 10 is a cross sectional view taken along a line X—X shown in FIG. 9, and FIG. 11 is a cross sectional view taken along a line XI—XI shown in FIG. 9.

The semiconductor substrate 31 includes an N-type well 32 formed by diffusing a low-concentration N-type impurity and a P-type well 33 formed by diffusing a low-concentration P-type impurity. The N-type well 32 is provided with the P-channel MOS transistor 21. More specifically, a gate electrode 21A is provided via a gate insulating film 21B on the N-type well 32. P$^+$-type diffusion regions 21C (drain region) and 21D (source region) are provided in the N-type well 32 on both sides of the gate electrode 21A, and in each of these regions a high-concentration P-type impurity is injected.

The gate electrode 21A is connected to a metal layer 15A via a contact plug 14C. The set signal SET is input to the metal layer 15A. The P$^+$-type diffusion region 21C is connected to a metal layer 15B via a contact plug 14A. The metal layer 15B is connected to the node S.

The P$^+$-type diffusion region 21D is connected to a metal layer 15C via a contact plug 14B. One end of the metal layer 15C is connected to the fuse element 1 via a contact plug 14D. The fuse element 1 is connected to a metal layer 15D via a contact plug 14E. An N$^+$-type diffusion region 34 is provided in the N-type well 32, and in this diffusion region, a high-concentration N-type impurity is injected. The N$^+$-type diffusion region 34 is connected to a metal layer 15D via a contact plug 14F.

Another end of the metal layer 15C is connected to the diode 20. More specifically, an N$^+$-type diffusion region 20A is provided in the P-type well 33, and in this diffusion region, a high-concentration N-type impurity is injected. The N$^+$-type diffusion region 20A is connected to the metal layer 15C via a contact plug 14G. As shown in FIG. 9, the N$^+$-type diffusion region 20A, which forms the diode 20, is provided as a new region separate from the N$^+$-type diffusion region, which forms the N-channel MOS transistors of the semiconductor memory device.

Figures 12, 13:
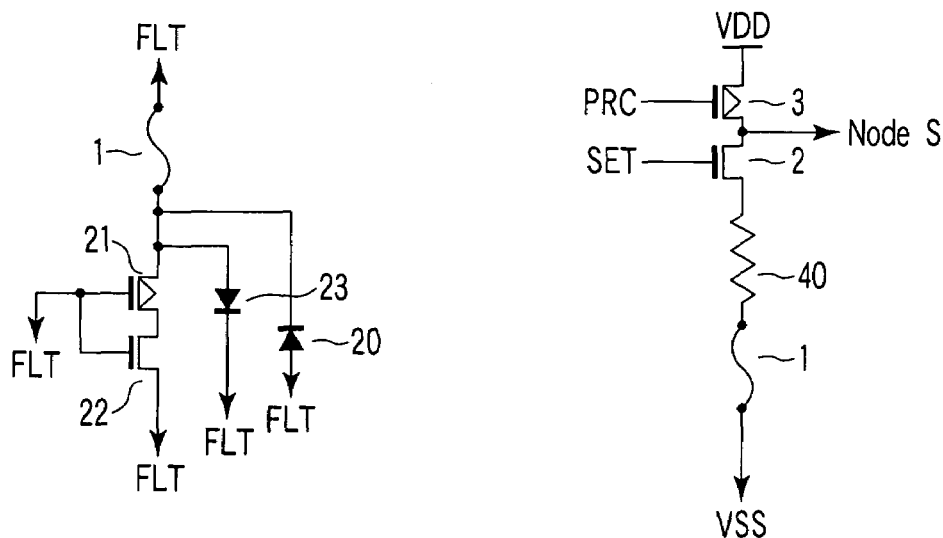
FIG. 12 is a circuit diagram equivalent to that of the semiconductor memory device shown in FIG. 7 in the case where a fuse element 1 is blown with a laser beam.
FIG. 13 is a circuit diagram showing a structure of a semiconductor memory device according to the third embodiment of the present invention.

Next, the operation of the semiconductor device when the fuse element 1 is blown with a laser beam will now be described. FIG. 12 is a circuit diagram equivalent to that of the semiconductor memory device shown in the case where the fuse element 1 is blown with a laser beam. This figure illustrates the main part of the semiconductor memory device shown in FIG. 7.

The diode 23 is illustrated by an equivalent diode which corresponds to a PN junction of the P-channel MOS transistor 2. The PN junction of the P-channel MOS transistor 2 is made of the P$^+$-type diffusion region 21D and the N-type well 32. The irradiation of the laser beam is carried out by a laser repair device without connecting the power to the semiconductor memory device. With this structure, each power node is in a floating state (FLT) which has a capacity inside the chip. Since the area of the well is so large that the floating state is not substantially different from the grounded state.

As described above, the diode 20 includes the N$^+$-type diffusion region 20A and the P-type well 33. In other words, the diode 20 is a diode connected in a backward direction with respect to the fuse element 1. With this arrangement, a negative charge generated in the fuse element 1 can be released to the P-type well 33 while blowing the fuse element 1 with a laser beam. Thus, the entering of the negative charge into the transistor 21 can be prevented, and thus it is possible to prevent the breakdown of the PN junction and insulating film of the transistor 21.

On the other hand, the diode 23 is a diode connected in a forward direction with respect to the fuse element 1. With this arrangement, a positive charge generated in the fuse element 1 can be released to the N-type well 32 while blowing the fuse element 1 with a laser beam. Thus, the entering of the positive charge into the transistor 21 can be prevented, and thus it is possible to prevent the breakdown of the PN junction and insulating film of the transistor 21.

As described above in detail, according to this embodiment, it is possible to prevent the breakdown of the P-channel MOS transistor 21 connected to the fuse element 1, which is caused by the positive charge generated while blowing the fuse element 1 with a laser beam.

Further, with the connection of the P-channel MOS transistor 21 to the fuse element 1, it is possible to prevent the breakdown of the P-channel MOS transistor 21, which is caused by the negative charge generated while blowing the fuse element 1 with a laser beam.

Third Embodiment

The third embodiment is a semiconductor memory device with such a structure that can prevent the breakdown of a transistor while applying a laser beam to a fuse element 1 by connecting a resistance element made of a diffusion layer between the fuse element 1 and the transistor.

FIG. 13 is a circuit diagram showing a main part of the structure of a semiconductor memory device according to the third embodiment of the present invention.

A precharge signal PRC is input to a gate of a P-channel MOS transistor 3, and a source of the transistor 3 is connected to a power potential VDD. A drain of the transistor 3 is connected to a node S.

A set signal SET is input to a gate of an N-channel MOS transistor 2. A drain of the transistor 2 is connected to the node S. A resistance element 40 is connected between a source of the transistor 2 and a terminal of the fuse element 1. Another terminal of the fuse element 1 is connected to the ground potential VSS. The arrangement of the latch circuit, etc. connected to the node S is the same as that of the first embodiment.

FIG. 14 is a diagram showing a layout of a structure of a main part (including the fuse element 1, the transistor 2 and the resistance element 40) of the semiconductor memory device shown in FIG. 13. FIG. 15 is a cross sectional view taken along a line XV—XV shown in FIG. 14.

The semiconductor substrate 11 includes a P-type well 12 formed by diffusing a low-concentration P-type impurity. An N-type well 41 is provided in the P-type well 12, and the well 41 is formed by diffusing a low-concentration N-type impurity. Two N⁺-type diffusion regions 42 and 43 are provided in the N-type well 41, and in each of these regions a high-concentration N-type impurity is injected.

The N⁺-type diffusion region 42 is connected to a metal layer 45 via a contact plug 44. The metal layer 45 is connected to the N⁺-type diffusion region 2D via a contact plug 14B. An N⁺-type diffusion region 43 is connected to a metal layer 47 via a contact plug 46. The metal layer 47 is connected to the fuse element 1 via a contact plug 14D.

In the semiconductor memory device having the above-described structure, the fuse element 1 and a source region of the N-channel MOS transistor 2 are connected to each other via the N-type well 41. Further, the N-type well 41 is formed to be isolated from the P-type well 12. In other words, the power is not connected to the N-type well 41.

The resistance element 40 shown in FIG. 13 corresponds to the N-type well 41 shown in FIG. 14. That is, the N-type well 41 serves as a resistance element. In this manner, a negative charge generated while blowing the fuse element 1 with a laser beam can be released to the P-type well 12 via the N-type well 41. Thus, it is possible to prevent the breakdown of the N-channel MOS transistor 2 due to the negative charge.

Further, the heat generated while blowing the fuse element 1 with a laser beam can be released through the semiconductor substrate 11. Thus, it is possible to prevent the breakdown of the N-channel MOS transistor 2 due to the heat.

It should be noted that in this embodiment, the N-type well 31 formed in the P-type well 12 is used as the resistance element 40. However, the present invention is not limited to this structure, but it is alternatively possible that the N-type diffusion region formed in the P-type well 12 is used as the resistance element 40.

In the meantime, this embodiment is applicable to the protection of the P-channel MOS transistor. More specifically, in the case where the transistor connected to the fuse element 1 is a P-channel MOS transistor, a resistance element made of a P-type well is arranged between the fuse element 1 and a source of the P-channel MOS transistor.

With this arrangement, a positive charge generated while blowing the fuse element 1 with a laser beam can be released through the P-type well. Thus, it is possible to prevent the breakdown of the P-channel MOS transistor due to the positive charge.

Further, the third embodiment and first embodiment can be combined together. FIG. 16 is a circuit diagram showing a structure of a main part of another version of the semiconductor memory device according to the third embodiment. In this version, an anode of the diode 9 is connected to the source of the transistor 2, and a cathode of the diode 9 is connected to the power potential VDD.

The diode 9 is made of the P⁺-type diffusion region 9A and the N-type well 13. (See the first embodiment.) That is, the diode 9 is a diode connected in a forward direction with respect to the source of the transistor 2. With this arrangement, a positive charge generated in the fuse element 1 while blowing the fuse element 1 with a laser beam can be released to the N-type well 13.

As described above, the heat can be released by the resistance element 40 and the positive charge can be released by the diode 9, and thus it is possible to prevent the breakdown of the PN junction and insulating film of the transistor 2.

It should be noted here that the anode of the diode 9 may be connected between the fuse element 1 and the resistance element 40. Even with this arrangement, the same advantageous effect as discussed above can be obtained.

It is naturally possible to combine the third embodiment with the second embodiment. When such a version is carried out, it suffices if the conductivity type of the semiconductor region that forms the resistance element 40 is changed.

Fourth Embodiment

The fourth embodiment is a semiconductor memory device with such a structure that a wire resistance and a wire capacitor are added between the fuse element 1 and an N-channel MOS transistor 2 in order to protect the N-channel MOS transistor 2.

FIG. 17 is a circuit diagram equivalent to a structure of a main part of a semiconductor memory device according to the fourth embodiment of the present invention. A resistance element 50 is connected between a source of the N-channel MOS transistor 2 and a terminal of the fuse element 1. A capacitor 51 is provided between the source of the N-channel MOS transistor 2 and the ground potential VSS. The rest of the arrangement is the same as that of the first embodiment.

Figure 18:
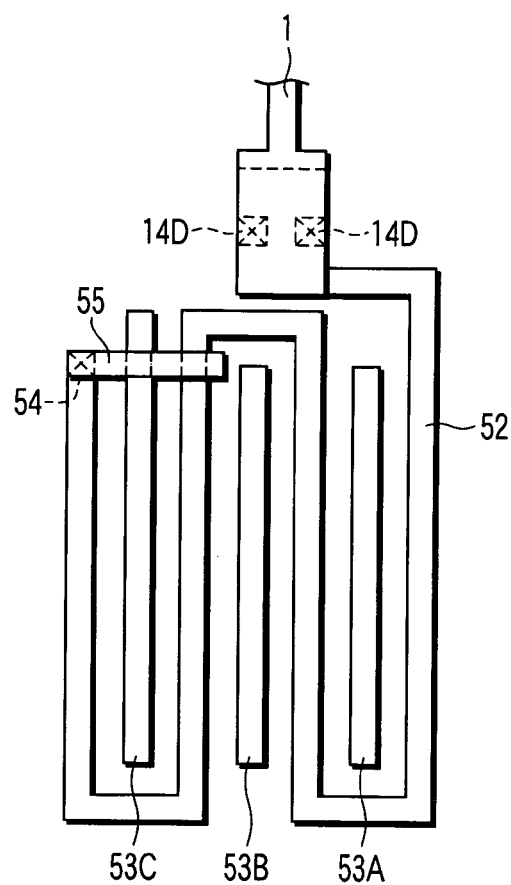
FIG. 18 is a diagram showing a layout of a structure of a main part of the semiconductor memory device shown in FIG. 17.

FIG. 18 is a diagram showing a layout of a structure (including the fuse element 1, the resistance element 50 and the capacitor 51) of the semiconductor memory device shown in FIG. 17. As shown in this figure, a wire portion 52 (for example, metal) is connected to the fuse element 1 via a contact plug 14D.

The wire portion 52 has such a structure where it is drawn to be long and meander, and thus the wire resistance is increased. Metal wires 53A to 53C are each provided between respective parts of the meandering wire portion 52 in order to add the wire capacitance to the wire portion 52. The metal wires 53A to 53C are connected to, for example, the ground potential VSS. With this arrangement, the wire capacitance can be added to the wire portion 52. It should be noted here that the power to be supplied to the metal wires 53A to 53C is not limited to the ground potential VSS, but it may be any potential as long as it can add the wire capacitance to the wire portion 52 (that is, a potential different from that of the wire portion 52).

A terminal of the wire portion 52 is connected to a metal layer 55 via a contact plug 54. The metal layer 55 is connected to the source region of the N-channel MOS transistor 2 (not shown).

The wire resistance of the wire portion 52 corresponds to the resistance element 50 shown in FIG. 17. That wire capacitance of the wire portion 52 corresponds to the capacitor 51 shown in FIG. 17.

In the semiconductor memory device having the above-described structure, a resistance element 50 is provided between the fuse element 1 and the N-channel MOS transistor 2. With this arrangement, it is possible to suppress the heat generated while blowing the fuse element 1 with a laser beam from propagating to the N-channel MOS transistor 2. Thus, it is possible to prevent the breakdown of the N-channel MOS transistor 2 due to the heat.

Further, with addition of the wire capacitance to the wire portion 52, the following advantage can be obtained in the case where the fuse element 1 is blown with a laser beam. That is, it is possible to suppress the potential at the source of the N-channel MOS transistor 2 from increasing even when the charge is accumulated in the fuse element 1. Therefore, it is possible to prevent the breakdown of the N-channel MOS transistor 2 due to the charge accumulated during laser blow.

It should be noted that this embodiment is applicable to the case where the transistor connected to the fuse element 1 is a P-channel MOS transistor.

In this embodiment, as the wire capacitance added to the wire portion 52 becomes larger, the anti-breakdown property of the transistor is improved more. However, if the wire capacitance is excessively large, the operation of the semiconductor memory device is adversely affected in some cases. In order to avoid this, a wire capacitor whose one end is released may be added to the connection node between the transistor 2 and transistor 3. With this arrangement, the operation of the semiconductor memory device can be stabilized.

Figure 19:
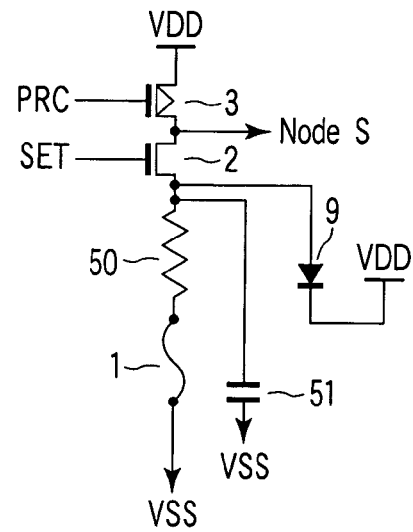
FIG. 19 is a circuit diagram showing a structure of a main part of another version of the semiconductor memory device according to the fourth embodiment.

Further, the fourth embodiment and first embodiment can be combined together. FIG. 19 is a circuit diagram showing a structure of a main part of another version of the semiconductor memory device according to the fourth embodiment. In this version, an anode of the diode 9 is connected to the source of the transistor 2, and a cathode of the diode 9 is connected to the power potential VDD.

With this arrangement, the heat can be released by the resistance element 50 and the positive charge can be released by the diode 9, and thus it is possible to prevent the breakdown of the PN junction and insulating film of the transistor 2.

It should be noted here that the anode of the diode 9 may be connected between the fuse element 1 and the resistance element 50. Even with this arrangement, the same advantageous effect as discussed above can be obtained. Further, it is naturally possible to combine the fourth embodiment with the second embodiment.

Fifth Embodiment

The fifth embodiment is a semiconductor memory device with such a structure that a contact plug that connects a fuse element 1 and a diffusion layer of a transistor is set distant from a gate of the transistor in order to protect the gate insulating film.

Figure 20:
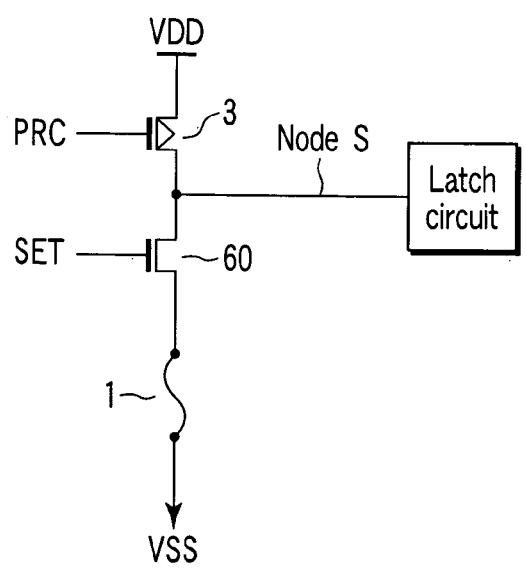
FIG. 20 is a circuit diagram showing a structure of a semiconductor memory device according to the fifth embodiment of the present invention.

FIG. 20 is a circuit diagram showing a structure of a semiconductor memory device according to the fifth embodiment of the present invention. As shown in this figure, a source of an N-channel MOS transistor 60 is connected to a terminal of a fuse element 1. A set signal SET is input to a gate of the transistor 60. A drain of the transistor 60 is connected to a drain of a P-channel MOS transistor 3. The rest of the structure is the same as that of the first embodiment.

Figure 21:
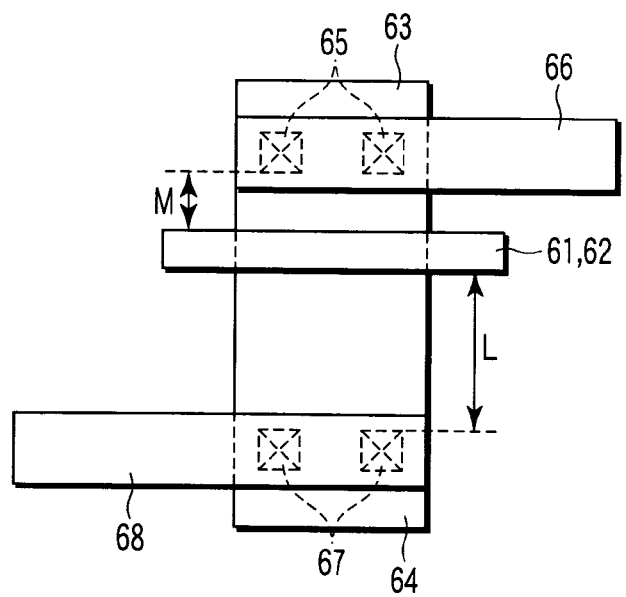
FIG. 21 is a diagram showing a layout of a structure of an N-channel MOS transistor 60 shown in FIG. 20.

FIG. 21 is a diagram showing a layout of a structure of the N-channel MOS transistor 60 shown in FIG. 20. The semiconductor substrate 31 includes a P-type well 12 (not shown) formed by diffusing a low-concentration P-type impurity.

The P-type well 12 is provided with the N-channel MOS transistor 60. More specifically, a gate electrode 62 is provided via a gate insulating film 61 on the P-type well 12. $N^+$-type diffusion regions 63 (drain region) and 64 (source region) are provided in the P-type well 12 on both sides of the gate electrode 62, and in each of these regions a high-concentration N-type impurity is injected.

The $N^+$-type diffusion region 63 is connected to a metal layer 66 via a contact plug 65. The metal layer 66 is connected to a node S. The $N^+$-type diffusion region 64 is connected to a metal layer 68 via a contact plug 67. The metal layer 68 is connected to the fuse element 1.

It should be noted here that a distance L between the gate electrode 62 and the contact plug 67 is larger than a distance M between the gate electrode 62 and the contact plug 65. The semiconductor substrate 11 includes, in addition to the transistor 60, a plurality of transistors (for example, those which form a latch circuit). The distance between the gate electrode and a contact plug connected to a diffusion region serving as a source region or drain region of a respective one of these transistors is the same as the distance M between the gate electrode 62 and the contact plug 65.

That is, the distance M is the value obtained when the characteristics of the transistors become optimal in relation to the area of the semiconductor memory device, the production process and the operations of its circuits. In this embodiment, the distance between the contact plug 67 connected to the fuse element 1 and the gate electrode 62 is intentionally set large.

For example, the distance M is determined based on the design rule of its generation. This design rule is determined based on the minimum processing measurements of the gate electrode, achieved by its manufacturing process (more specifically, the accuracy of a lithography machine).

An actually manufactured example of the semiconductor memory device will now be described. In this example, the gate length is about 0.04 μm, the size of the contact plug (lengths in both vertical and horizontal directions) is about 0.09 μm, the effective thickness of the gate oxide film is about 1 nm, and the distance M is about 0.08 μm. These numerical values are determined based on the minimum processing measurements of the design rule. In other words, a transistor with the above-listed measurements can be made minute with desired operation characteristics.

FIG. 22 is a graph illustrating a relation between a distance L between a gate and contact, and a yield, with a horizontal axis indicating the distance L (μm) and a vertical axis indicating the yield (%). The number of samples was 300. This graph illustrates three plots for the cases where the energy E of the laser beam applied by the laser repair device is varied (E=1 μJ, 1.5 μJ and 1 μJ).

FIG. 23 is a diagram indicating the ratio between the distance L and other numerical values of the transistor 60. This figure illustrates the ratio obtained from the distance M, the size of the contact plug (contact size), the gate length and the effective gate oxide thickness (Tox).

As can be understood from FIG. 22, when the energy E=1.0 μJ, the yield is 100% for a distance L of 0.18 μm or more. In other words, even if the fuse element 1 is blown with a laser beam, the transistor 60 is not broken down at all. Therefore, with this arrangement, the semiconductor memory device can be mass-produced to be used. The conditions for the distance L can be expressed in terms of the ratio illustrated in FIG. 23 as follows.

(1-1) 2.5 times long as or more then the distance M (1-2) 2 times large as or more then the size of the contact plug (1-3) 4.5 times long as or more then the gate length (1-4) 180 times large as or more then the effective gate oxide film thickness Here, it is considered possible that the energy capable of blowing the fuse varies depending on the state of the fuse element, the error of the laser repair device, etc. Therefore, in consideration of the energy of the laser beam that may vary, when the energy E=1.5 µJ (that is, a margin of 0.5 µJ), the yield becomes 100% for a distance L of 0.48 µm or more. In this case, the conditions for the distance L can be expressed as follows.

(2-1) 6 times long as or more then the distance M (2-2) 5.5 times large as or more then the size of the contact plug (2-3) 12 times long as or more then the gate length (2-4) 480 times large as or more then the effective gate oxide film thickness When the transistor 60 is formed under the above-listed conditions, it is possible to suppress the electric field induced by the charge generated while applying the laser beam to the fuse element 1 from concentrating on the gate insulating film 61. In this manner, the gate insulating film 61 can be protected from destruction.

It should be noted that the fifth embodiment can be combined with some other embodiment.

Sixth Embodiment

The second embodiment is a semiconductor memory device with such a structure that can prevent the breakdown of a gate insulating film duce to the charge generated while applying a laser beam to a fuse element 1 by increasing the thickness of the gate insulating film of an N-channel MOS transistor 70 connected to the fuse element 1.

A circuit diagram of the semiconductor memory device of this embodiment would be the same as that of FIG. 20 except that the transistor 60 illustrated in the fifth embodiment is replaced by the transistor 70, and therefore the circuit diagram of the semiconductor of this embodiment will be omitted.

FIG. 24 is a cross sectional view showing the structure of the N-channel MOS transistor 70 according to the sixth embodiment of the present invention. The semiconductor substrate 11 includes a P-type well 12 formed by diffusing a low-concentration P-type impurity. The P-type well 12 is provided with the N-channel MOS transistor 70.

More specifically, a gate insulating film 71 is provided on the P-type well 12. The gate insulating film 71 is made of, for example, $SiO_2$. A gate electrode 72 is provided on the gate insulating film 71. $N^+$-type diffusion regions 73 (drain region) and 74 (source region) are provided in the P-type well 12 on both sides of the gate electrode 72, and in each of these regions a high-concentration N-type impurity is injected.

A set signal SET is supplied to the gate electrode 72. The $N^+$-type diffusion region 73 is connected to a drain of the P-channel MOS transistor 3, and the $N^+$-type diffusion region 73 is connected to the fuse element 1.

Further, the semiconductor substrate 11 is provided with a latch circuit, etc. FIG. 25 is a cross sectional view showing a structure of an N-channel MOS transistor 75 that forms a latch circuit. For example, the N-channel MOS transistor 75 corresponds to the N-channel MOS transistor 5 contained in the latch circuit shown in FIG. 1.

A gate insulating film 76 is provided on the P-type well 12. A gate electrode 77 is provided on the gate insulating film 76. $N^+$-type diffusion regions 78 (drain region) and 79 (source region) are provided in the P-type well 12 on both sides of the gate electrode 77, and in each of these regions a high-concentration N-type impurity is injected.

The gate insulating film 76 of the transistor 75 has a film thickness O. The transistors are usually formed by the same manufacturing process. Therefore, those transistors formed on the semiconductor substrate 11 than the transistor 70 each have a gate insulating film of the same thickness as thickness O.

It should be noted here that the thickness N of the gate insulating film 71 of the transistor 70 is larger than the thickness O of the gate insulating film 76 of the transistor 75. The thickness N of the gate insulating film 71 is set to such a thickness that the gate insulating film 71 is not broken down despite the surge stress due to the charge generated while applying a laser beam to the fuse element 1.

A semiconductor memory device was actually manufactured as an example and the example will now be described. In this example, the gate length, the size of the contact plug and the effective gate oxide film thickness are the same as those described in the fifth embodiment. That is, in this example, the film thickness O is about 1 nm.

The inventors of the present invention prepared semiconductor memory device samples whose film thickness N was varied in a range of 2 to 5 times large as the film thickness O, and the fuse blow experiment was repeated on these samples. The energy of the laser beam was about 1 to 1.5 µJ. The results of the experiments indicate that when the film thickness N was set to 3 times or more of the thickness O, a yield of 100% can be obtained. That is, if the fuse element 1 is blown with a laser beam, the transistor 70 is not. broken down at all.

As described in detail, according to this embodiment, it is possible to improve the withstand voltage of the gate insulating film 71 of the N-channel MOS transistor 70 against the surge stress due to the charge generated during the application of laser beam. Thus, the breakdown of the N-channel MOS transistor 70 can be prevented.

It should be noted here that a transistor with a thick gate insulating film would conventionally have to have a large element area since it requires a large gate length. When a transistor with a thick gate insulating film is limited to a transistor to which the surge stress is directly impressed while applying a laser beam to the fuse, or those located nearby, the increase in the chip area can be suppressed to a minimum level.

It is natural that this embodiment is applicable if the transistor connected to the fuse element 1 of a P-channel MOS transistor.

Further, it is also naturally possible to combine the fourth embodiment with the second embodiment.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   a fuse element including a first terminal and a second terminal, which stores data based on whether or not it is electrically blown by a laser beam;
   a node in which the data is transferred;
   a semiconductor region provided in a substrate; and
   a first transistor provided between the first terminal and the node, which sets the data to the node, and includes a gate insulating film provided on the semiconductor region, a first gate electrode provided on the gate insulating film and a first source region and a first drain region provided in the semiconductor region, the first source region being connected to the first terminal via a first contact plug, the first drain region being connected to the node via a second contact plug,
   wherein a first distance between the first gate electrode and the first contact plug is longer than a second distance between the first gate electrode and the second contact plug.

2. The semiconductor memory device according to claim 1, wherein the first distance is set such that the gate insulating film is not broken down due to a charge generated with the laser beam.

3. The semiconductor memory device according to claim 1, wherein the first distance is 3 times or more of the second distance.

4. The semiconductor memory device according to claim 1, further comprising: a latch circuit connected to the node and including a plurality of second transistors,
   wherein each of the plurality of second transistors includes a second gate electrode, a second source region and a second drain region, and
   a distance between the second gate electrode and each of third contact plugs connected respectively to the second source region and the second drain region is the same as the second distance.

* * * * *